United States Patent
Ching et al.

(10) Patent No.: US 9,984,938 B2
(45) Date of Patent: *May 29, 2018

(54) INTEGRATE CIRCUIT WITH NANOWIRES

(71) Applicant: Taiwan Semiconductor Manufacturing Company, Ltd., Hsin-Chu (TW)

(72) Inventors: Kuo-Cheng Ching, Hsinchu County (TW); Jiun-Jia Huang, Yunlin County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/165,947

(22) Filed: May 26, 2016

(65) Prior Publication Data
US 2016/0268172 A1  Sep. 15, 2016

Related U.S. Application Data

(63) Continuation of application No. 14/806,383, filed on Jul. 22, 2015, now Pat. No. 9,355,915, which is a
(Continued)

(51) Int. Cl.
*H01L 21/8234* (2006.01)
*H01L 21/8238* (2006.01)
(Continued)

(52) U.S. Cl.
CPC ...... *H01L 21/823821* (2013.01); *B82Y 10/00* (2013.01); *B82Y 40/00* (2013.01);
(Continued)

(58) Field of Classification Search
CPC ... H01L 29/78; H01L 29/0673; H01L 29/775; H01L 29/66439; H01L 29/42376;
(Continued)

(56) References Cited

U.S. PATENT DOCUMENTS 7,910,917 B2  3/2011 Ernst et al.
8,399,314 B2  3/2013 Cohen
(Continued)

*Primary Examiner* — Hung Vu
(74) *Attorney, Agent, or Firm* — Haynes and Boone, LLP

(57) ABSTRACT

A method includes providing a substrate having a first gate region for a first device and a second gate region for a second device, the first and second gate regions having different channel lengths. The method further includes forming first and second fins in at least the first and second gate regions respectively, and forming first and second stacks of semiconductor layers over the first and second fins respectively. The method further includes performing an oxidation process to the first and second stacks, thereby forming first and second semiconductor wires in the first and second gate regions respectively. Each of the first and second semiconductor wires is wrapped by a semiconductor oxide layer. The first and second semiconductor wires have different cross-sectional geometries in a respective plane that is perpendicular to their respective longitudinal direction.

20 Claims, 9 Drawing Sheets

Related U.S. Application Data continuation of application No. 14/477,588, filed on Sep. 4, 2014, now Pat. No. 9,111,784, which is a continuation of application No. 14/010,196, filed on Aug. 26, 2013, now Pat. No. 8,872,161.

(51) Int. Cl.

| | | |
|---|---|---|
| *H01L 29/423* | (2006.01) | |
| *H01L 27/092* | (2006.01) | |
| *H01L 29/06* | (2006.01) | |
| *H01L 29/165* | (2006.01) | |
| *H01L 21/02* | (2006.01) | |
| *H01L 29/10* | (2006.01) | |
| *H01L 29/78* | (2006.01) | |
| *H01L 29/51* | (2006.01) | |
| *H01L 29/66* | (2006.01) | |
| *H01L 29/775* | (2006.01) | |
| *B82Y 10/00* | (2011.01) | |
| *B82Y 40/00* | (2011.01) | |
| *H01L 21/84* | (2006.01) | |
| *H01L 29/786* | (2006.01) | |
| *H01L 21/311* | (2006.01) | |
| *H01L 29/49* | (2006.01) | |

(52) U.S. Cl.
CPC .. *H01L 21/02233* (2013.01); *H01L 21/02236* (2013.01); *H01L 21/02238* (2013.01); *H01L 21/02255* (2013.01); *H01L 21/31105* (2013.01); *H01L 21/82385* (2013.01); *H01L 21/823431* (2013.01); *H01L 21/823807* (2013.01); *H01L 21/823878* (2013.01); *H01L 21/84* (2013.01); *H01L 27/092* (2013.01); *H01L 27/0922* (2013.01); *H01L 27/0924* (2013.01); *H01L 29/0673* (2013.01); *H01L 29/0692* (2013.01); *H01L 29/1037* (2013.01); *H01L 29/165* (2013.01); *H01L 29/42376* (2013.01); *H01L 29/42392* (2013.01); *H01L 29/517* (2013.01); *H01L 29/66439* (2013.01); *H01L 29/775* (2013.01); *H01L 29/7854* (2013.01); *H01L 29/78696* (2013.01); *H01L 29/495* (2013.01); *H01L 29/4966* (2013.01)

(58) Field of Classification Search
CPC ............... H01L 27/092; H01L 27/0924; H01L 29/1033; H01L 29/1037; H01L 29/7854; H01L 21/923807; H01L 21/823821; H01L 21/92385; H01L 21/823878
USPC .................................................. 438/275, 279
See application file for complete search history.

(56) References Cited

U.S. PATENT DOCUMENTS

| | | |
|---|---|---|
| 8,399,330 B2 | 3/2013 | Liu et al. |
| 8,519,479 B2 | 8/2013 | Bangsaruntip et al. |
| 8,575,009 B2 | 11/2013 | Sleight |
| 8,658,518 B1 | 2/2014 | Chang |
| 8,710,490 B2 | 4/2014 | Pillarisetty et al. |
| 8,872,151 B2 | 10/2014 | Ching et al. |
| 9,111,784 B2 | 8/2015 | Ching et al. |
| 9,355,915 B2 * | 5/2016 | Ching ................. H01L 29/0673 |
| 2011/0018065 A1 * | 1/2011 | Curatola ................ B82Y 10/00 257/368 |
| 2011/0291190 A1 * | 12/2011 | Xiao ...................... B82Y 10/00 257/347 |

* cited by examiner

INTEGRATE CIRCUIT WITH NANOWIRES

This is a continuation of U.S. patent application Ser. No. 14/806,383, entitled "Integrate Circuit with Nanowires" and filed Jul. 22, 2015, which is a continuation of U.S. patent application Ser. No. 14/477,588, entitled "Integrate Circuit with Nanowires" and filed Sep. 4, 2014, now issued U.S. Pat. No. 9,111,784, issued Aug. 18, 2015, which is a continuation of U.S. patent application Ser. No. 14/010,196, entitled "Integrate Circuit with Nanowires" and filed Aug. 26, 2013, now issued U.S. Pat. No. 8,872,161, issued Oct. 28, 2014. The entire disclosure of these applications is herein incorporated by reference.

BACKGROUND

The integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a semiconductor device with nanowires, has been introduced to replace a planar transistor. It is desired to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
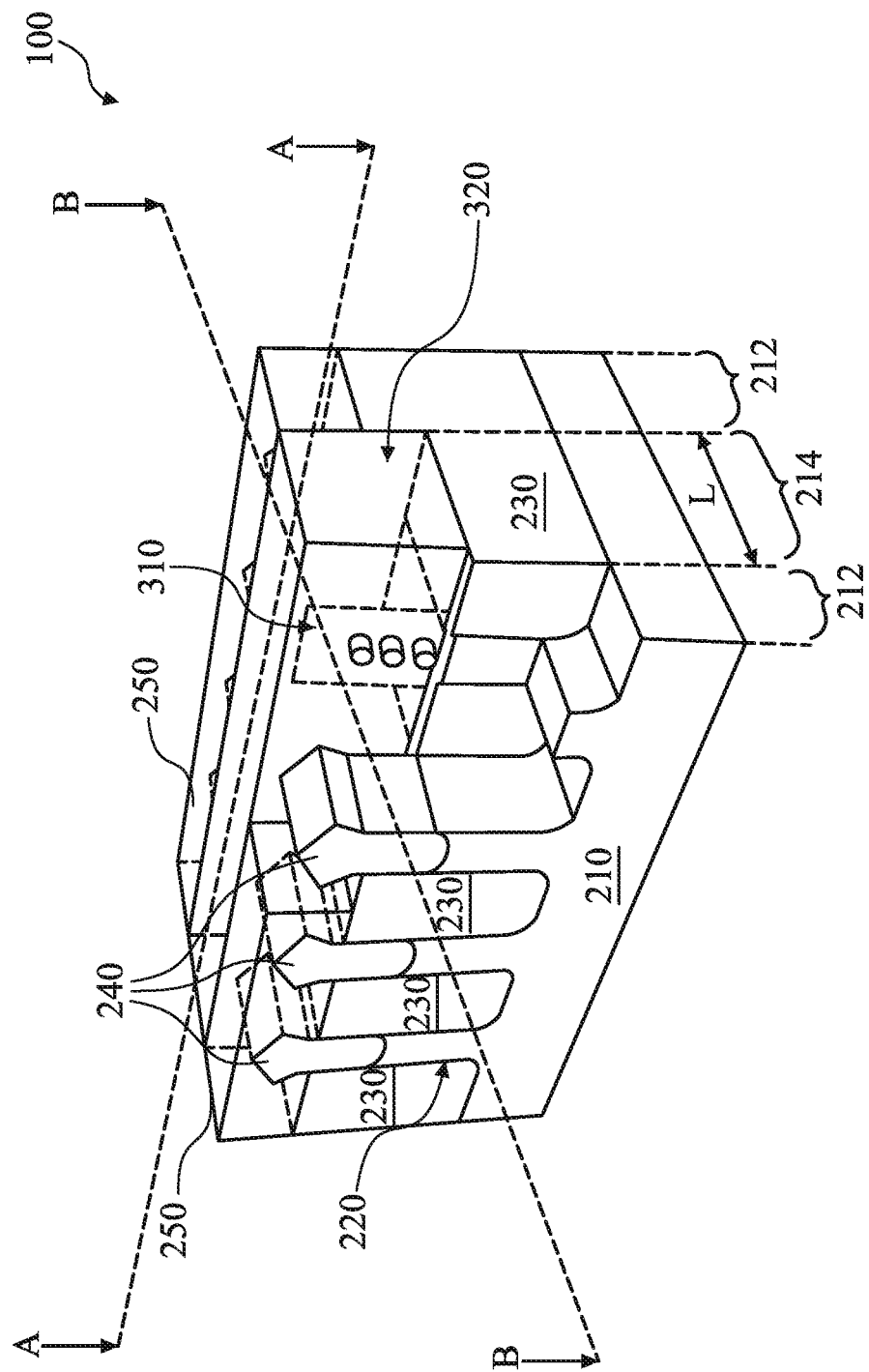
FIG. 1A is a diagrammatic perspective view of an integrated circuit (IC) with nanowire according to an embodiment of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure is directed to, but not otherwise limited to, a complementary metal-oxide-semiconductor (CMOS) device comprising a P-type metal-oxide-semiconductor (PMOS) device and an N-type metal-oxide-semiconductor (NMOS) device. The following disclosure will continue with a CMOS device example to illustrate various embodiments of the present invention. It is understood, however, that the present disclosure should not be limited to a particular type of device, except as specifically claimed.

Figure 1C:
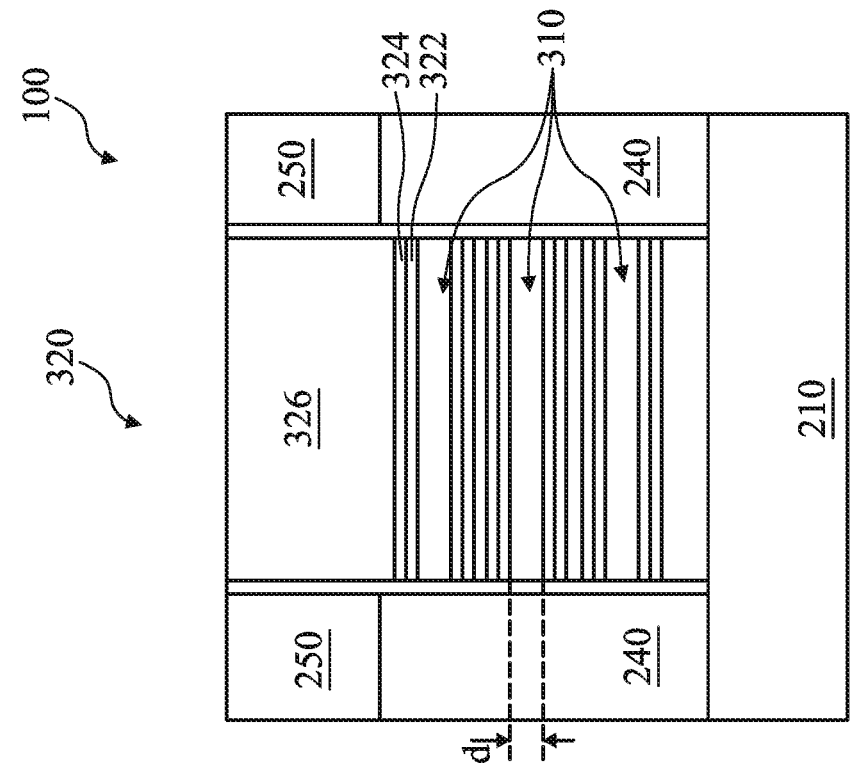
FIG. 1C is a cross-sectional view of an IC with nanowires along line B-B in FIG. 1A. The line B-B is perpendicular to the line A-A.
Figure 1B:
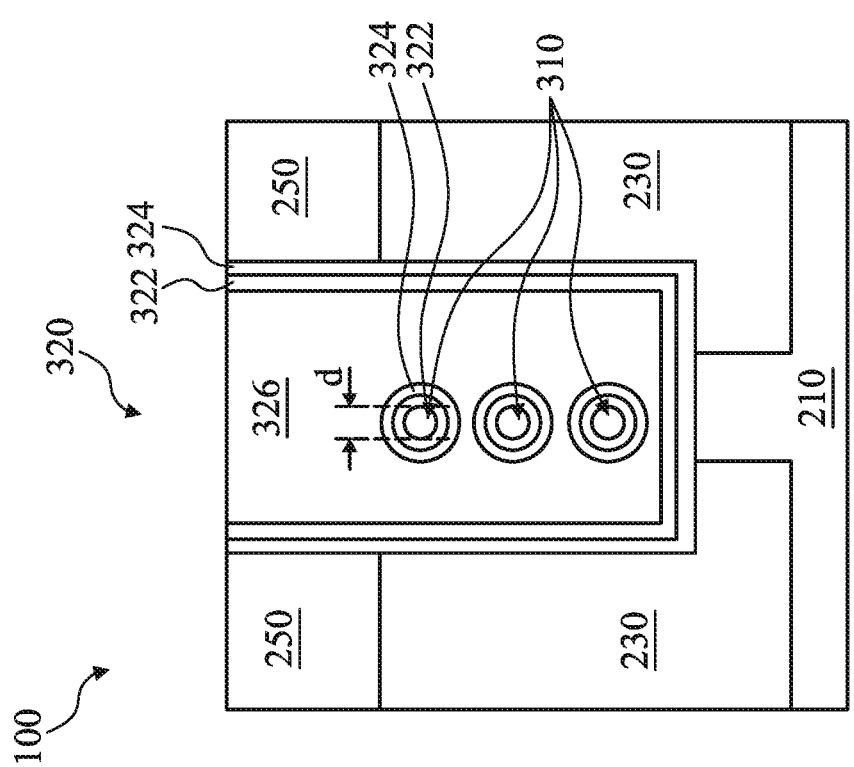
FIG. 1B is a cross-sectional view of an IC with nanowires along line A-A in FIG. 1A.
Figure 1D:
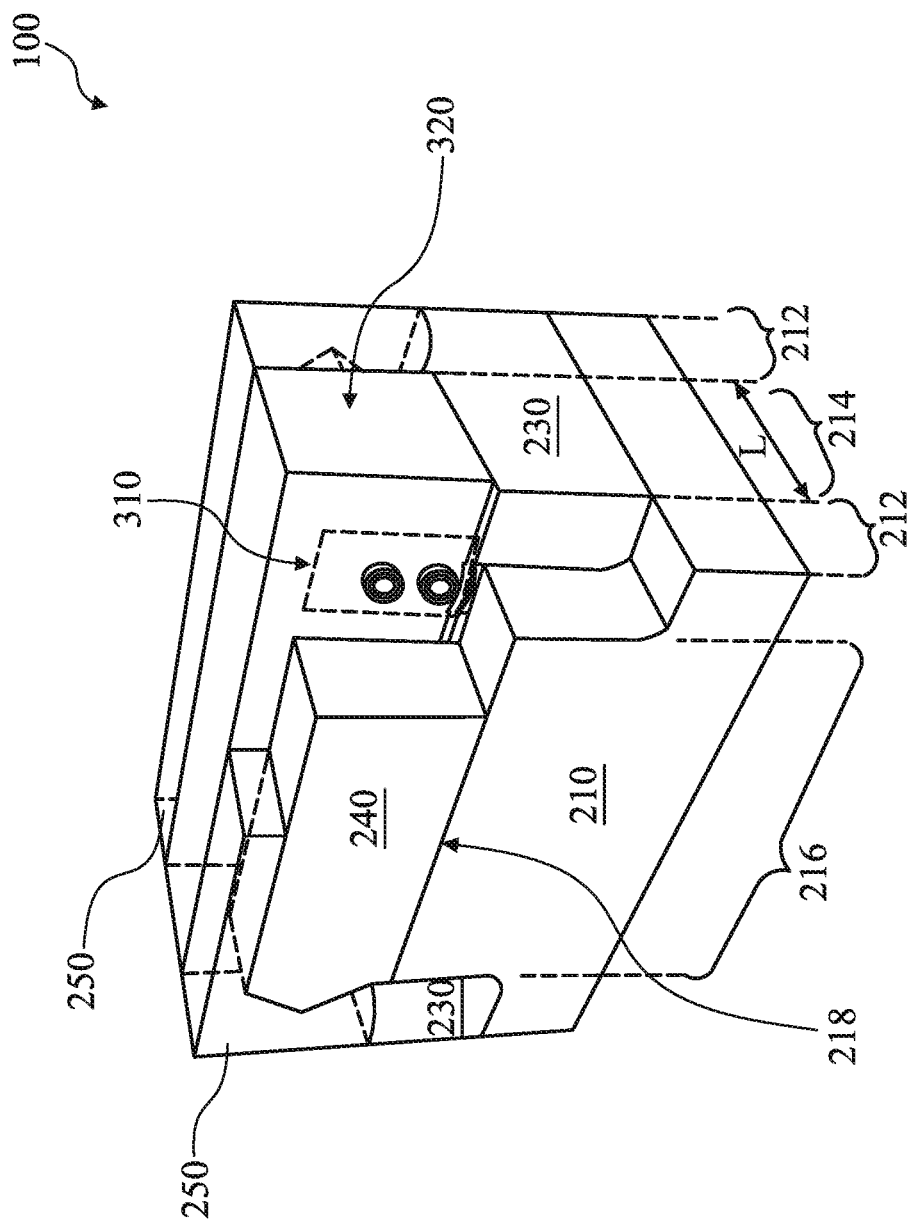
FIG. 1D is a diagrammatic perspective view of an IC with nanowire according to an embodiment of the present disclosure.

FIG. 1A is a side-perspective view of an IC 100 according to an embodiment of the present disclosure. FIGS. 1B and 1C are cross-section views of the IC 100 along line A-A and B-B, respectively, of FIG. 1A. The line B-B is perpendicular to the direction of the line of A-A. FIG. 1D is a side-perspective view of the IC 100 according to another embodiment of the present disclosure. The remaining figures provide side and cross-sectional views of the IC 100, according to various stages of fabrication.

Referring to FIGS. 1A-1C, the IC 100 may be a part of a larger integrated circuit (IC) with a plurality of different devices, regions, and areas, such as a p-type MOS (PMOS) and/or an N-type MOS (NMOS) in and on a substrate 210. As shown in the figure, the substrate 210 includes a source/drain region 212 and a gate region 214 having a length L, which may vary throughout the device. For example, the gate region can have a first length $L_1$ at one location, and a second length $L_2$ at another. In the present embodiment, the second length $L_2$ is larger than 20 nm, which is more than 20% longer than the first length $L_1$. The gate region 214 having the first length $L_1$ is referred to as a short channel gate region while the gate region 214 having the second length $L_2$ is referred to as a long channel gate region. The source/drain regions 212 are separated by the gate region 214.

In the present embodiment, the substrate 210 is a bulk silicon substrate. Alternatively, the substrate 210 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 210 also include a semiconductor-on-insulator substrate, such as silicon-on-insulator (SOI), SiGe-On-Insulator (SGOI), Ge-On-Insulator substrates. For example, SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process.

The substrate 210 may include various doped regions depending on design requirements as known in the art. The doped regions may be doped with p-type dopants, such as boron or BF2; n-type dopants, such as phosphorus or arsenic; or combinations thereof. The doped regions may be formed directly on the substrate 210, in a P-well structure, in an N-well structure, in a dual-well structure, or using a raised structure.

A recessed first fin 220 is formed in the source/drain region 212. In one embodiment, the recessed first fin 220 is formed by forming a first fin over the substrate 210 first and recessing the first fin. The first fin may be formed by any suitable process including various deposition, photolithography, and/or etching processes. In an example, the first fin is formed by patterning and etching a portion of the silicon substrate 210. In another example, the first fin is formed by patterning and etching a silicon layer deposited overlying an insulator layer (for example, an upper silicon layer of a silicon-insulator-silicon stack of an SOI substrate). It is understood that first fin may include multiple parallel fins formed in a similar manner.

Various isolation regions 230 are formed on the substrate 210 to isolate active regions. For example, the isolation region 230 separates the first fins. The isolation region 230 may be formed using traditional isolation technology, such as shallow trench isolation (STI), to define and electrically isolate the various regions. The isolation region 230 includes silicon oxide, silicon nitride, silicon oxynitride, an air gap, other suitable materials, or combinations thereof. The isolation region 230 is formed by any suitable process. As one example, the formation of an STI includes a photolithography process, etching a trench in the substrate (for example, by using a dry etching and/or wet etching), and filling the trench (for example, by using a chemical vapor deposition process) with one or more dielectric materials. The trenches may be partially filled, as in the present embodiment, where the substrate remaining between trenches forms a fin structure. In some examples, the filled trench may have a multi-layer structure such as a thermal oxide liner layer filled with silicon nitride or silicon oxide.

Then the first fin is recessed to form the recessed first fin 220. The recessing process may include dry etching process, wet etching process, and/or combination thereof. The recessing process may also include a selective wet etch or a selective dry etch. A wet etching solution includes a tetramethylammonium hydroxide (TMAH), a HF/HNO3/CH3COOH solution, or other suitable solution. Dry etching processes include a biased plasma etching process that uses a chlorine-based chemistry. Other dry etchant gasses include $CF_4$, $NF_3$, $SF_6$, and He.

A source/drain feature 240 is formed over the recessed first fin 220 in the source/drain region 212. In one embodiment, a first semiconductor material layer is deposited over the recessed first fin 220 by epitaxial growing processes to form the source/drain feature 240. The epitaxial processes include CVD deposition techniques (e.g., vapor-phase epitaxy (VPE) and/or ultra-high vacuum CVD (UHV-CVD)), molecular beam epitaxy, and/or other suitable processes. The first semiconductor material layers may include germanium (Ge), silicon (Si), gallium arsenide (GaAs), aluminum gallium arsenide (AlGaAs), silicon germanium (SiGe), gallium arsenide phosphide (GaAsP), or other suitable materials. The source/drain features 240 may be in-situ doped during the epi process. For example, the epitaxially grown SiGe source/drain features 240 may be doped with boron; and the epitaxially grown Si epi source/drain features 240 may be doped with carbon to form Si:C source/drain features, phosphorous to form Si:P source/drain features, or both carbon and phosphorous to form SiCP source/drain features. In one embodiment, the source/drain features 240 are not in-situ doped, an implantation process (i.e., a junction implant process) is performed to dope the source/drain features 240.

Alternatively, an intra-region 216 is formed between two isolation regions 230, as shown in FIG. 1D. In the intra-region 216, each individual first fin is removed to form a mesa 218 over the substrate 210. A common source/drain feature 240 is formed over the mesa 218 in the source/drain region 212. In one embodiment, the common source/drain feature 240 connects directly to each nanowire set 310 in the gate region 214.

An interlayer dielectric (ILD) layer 250 over the substrate 210, including between the source/drain features 240. The ILD layer 250 includes silicon oxide, oxynitride or other suitable materials. The ILD layer 250 may include a single layer or multiple layers. The ILD layer 250 is formed by a suitable technique, such as CVD, ALD and spin-on (SOG). A chemical mechanical polishing (CMP) process may be performed to planarize the top surface of the ILD layer 250.

In the present embodiments, one or more nanowire sets 310 and high-k/metal gates (HK/MG) 320 are formed over the substrate 210 in the gate region 214. Each nanowire set 310 may have a single nanowire or multiple nanowires. Each nanowire of one nanowire set 310 may connect with respective source/drain feature 240. In one embodiment, the nanowire set 310 connects with the respective source/drain feature 240 directly. The nanowire in the nanowire set 310 may be formed as a rod-shape-like and has a diameter d, which will be described more details later.

The HK/MG 320 may include an interfacial layer (IL) 322, a HK dielectric layer 324 and a MG 326. The IL 322 and HK dielectric layer 324 are disposed over the substrate 210, including conformably wrapping over the nanowire set 310. The HK dielectric layer 324 may include LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, HfAlO, Si3N4, oxynitrides (SiON), or other suitable materials. The IL 322 and HK dielectric layer 324 may be deposited by ALD or other suitable method.

The MG 326 may include a single layer or multi layers, such as metal layer, liner layer, wetting layer, and adhesion layer. The MG 326 may include Ti, Ag, Al, TiAlN, TaC, TaCN, TaSiN, Mn, Zr, TiN, TaN, Ru, Mo, Al, WN, Cu, W, or any suitable materials. The MG 326 may be formed by ALD, PVD, CVD, or other suitable process. The MG 326 may be formed separately for the NMOS and PMOS with different metal layers.

The following description will be directed to the formation and structure of the nanowire set 310 in the gate region 214 in process stages, which are earlier than the stage of FIG. 1A-1C. An example of the formation and structure of the nanowire set 310 is shown in FIGS. 2A-2C.

Figure 2A:
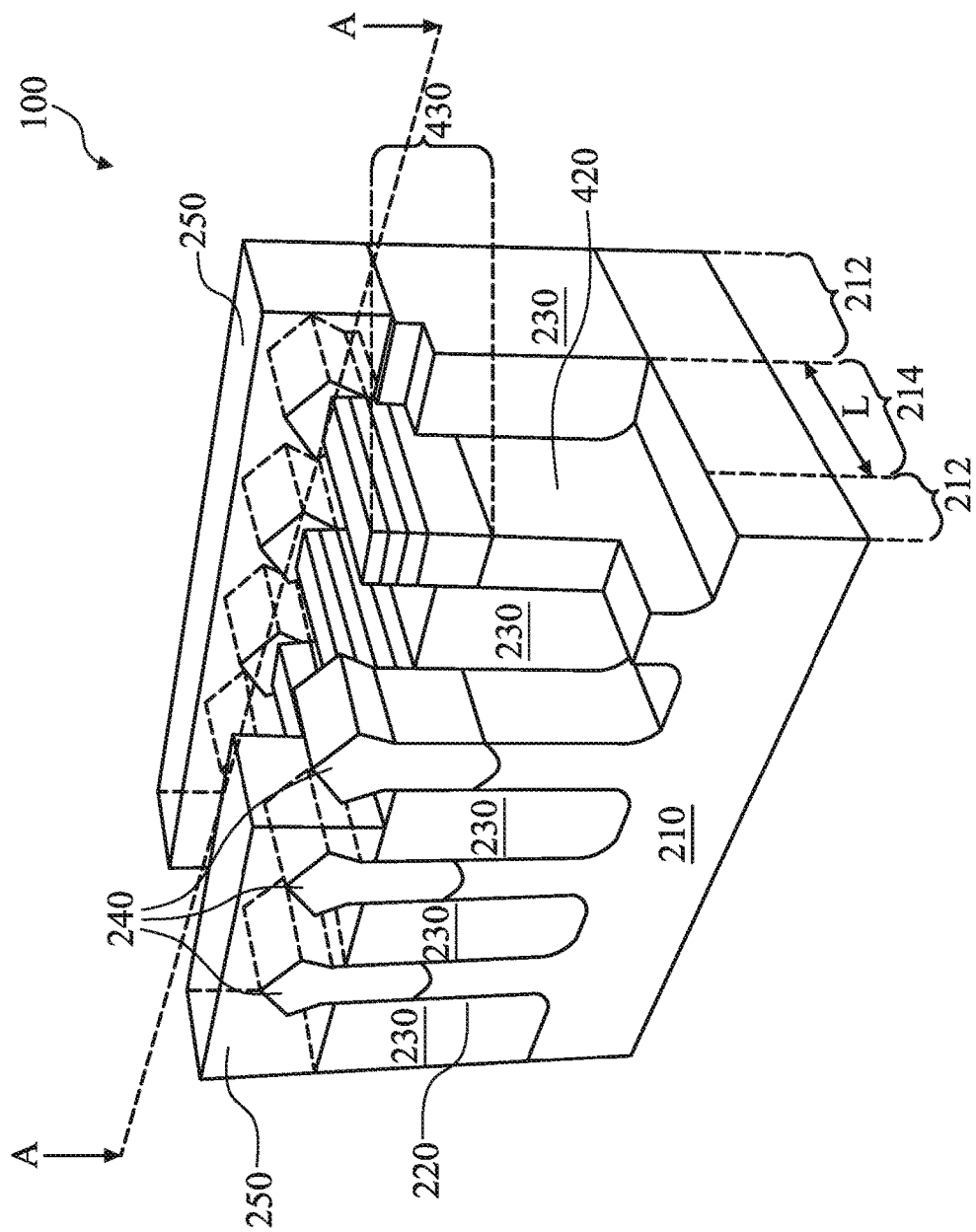
FIG. 2A is a diagrammatic perspective view of an IC with nanowire according to an embodiment of the present disclosure.
Figure 2B:
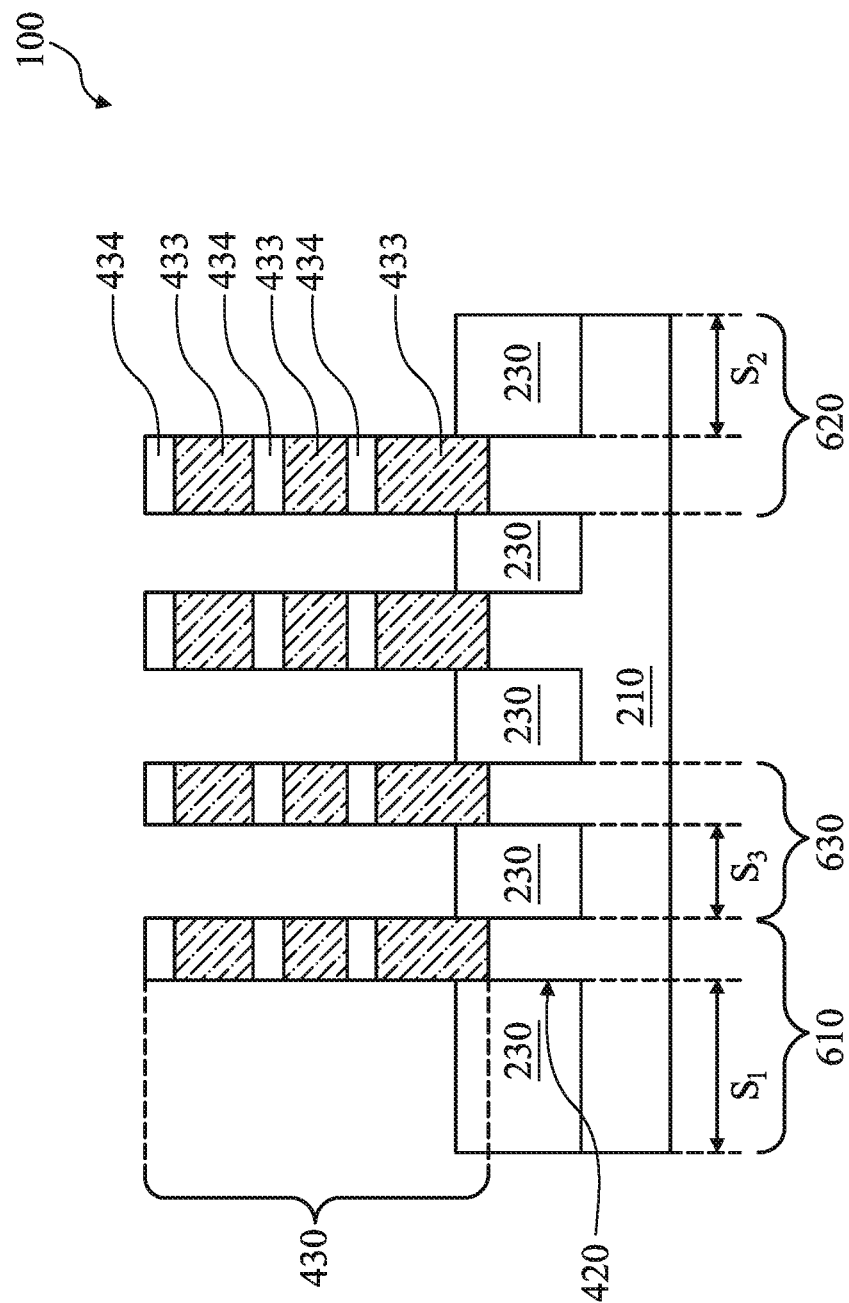
FIGS. 2B-2C and 3A-3B are cross-sectional views of an example IC with nanowire along line A-A in FIG. 2A.
Figure 2C:
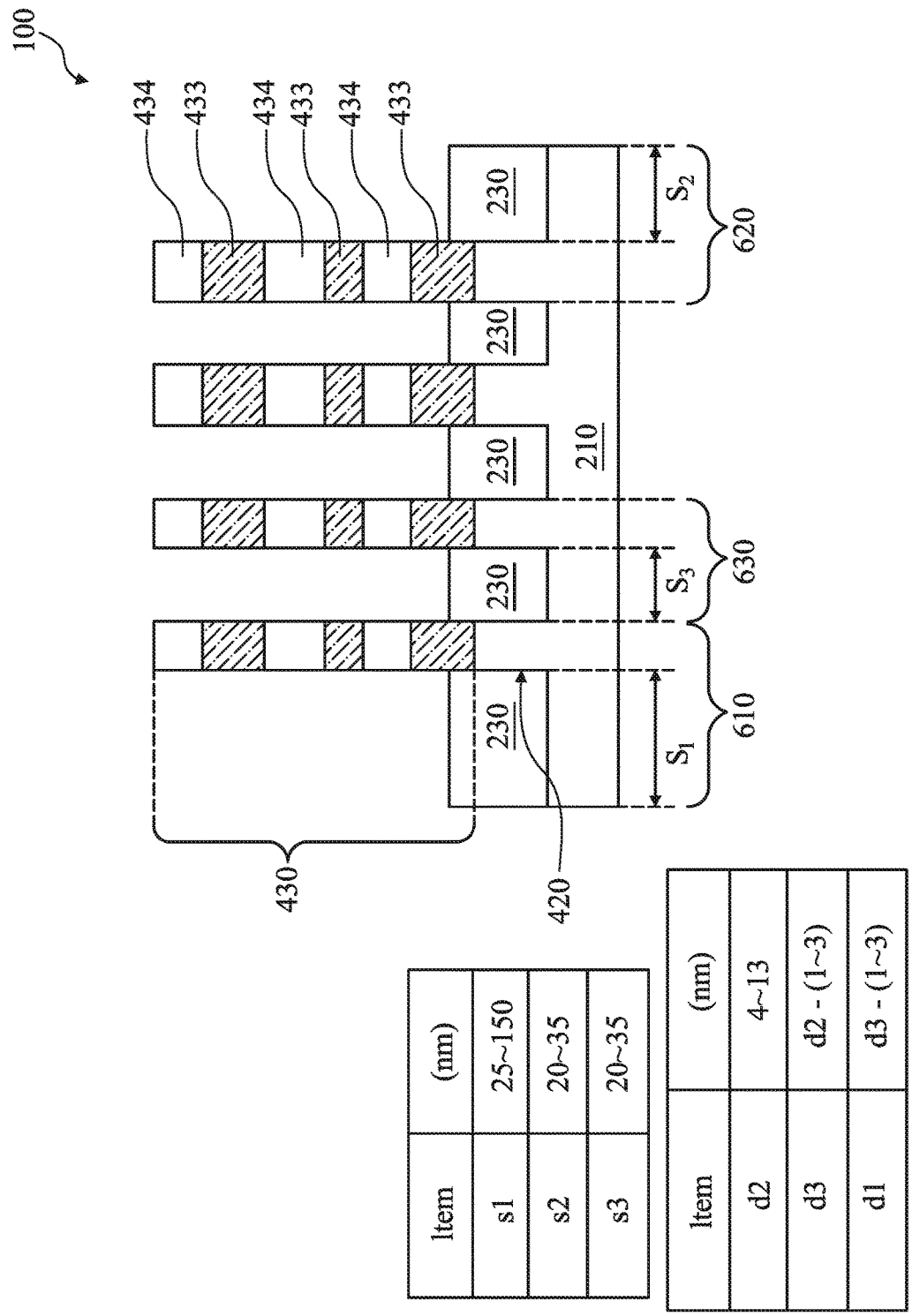

Referring to FIGS. 2A-2C, a second fin 420 is formed over the substrate 210 in the gate region 214. A formation of the second fin 420 is similar in many respects to the first fin 220 discussed above in association with FIG. 1A. In one embodiment, the recessed first fin 220 and second fin 420 are same fins. The isolation region 230 is disposed between second fins 420.

In the present embodiment, the second fins 420 are recessed and a semiconductor layer stack 430 is formed over the recessed second fin 420. The semiconductor layer stack 430 may include multiple semiconductor layers. Each of these semiconductor layers may have substantial different thickness to each other. The semiconductor layer stack 430 may include germanium (Ge), silicon (Si), gallium arsenide (GaAs), silicon germanium (SiGe), gallium arsenide phosphide (GaAsP), or other suitable materials. The semiconductor layer stack 430 may be deposited by epitaxial growing processes, such as CVD, VPE, UHV-CVD, molecular beam epitaxy, and/or other suitable processes.

In one embodiment, in a PMOS unit (as shown in FIG. 2B), the semiconductor layer stack 430 has (from bottom to top) SiGe (433)/Si(434)/SiGe(433)/Si(434)/SiGe(433)/Si (434) while in NMOS unit (as shown in FIG. 2C) has SiGe (433)/Si (434)/SiGe (433)/Si(434)/SiGe(433).

The semiconductor layer stack 430 may include other suitable combinations of different semiconductor layers. A chemical CMP process may be performed to planarize the top surface of the semiconductor layer stack 430 with the isolation region 230.

In the present embodiment, the isolation region 230 may be etched back to form an open spacing to laterally expose at least a portion of the semiconductor layer stack 430. The etching processes may include selective wet etch or selective dry etch, such that having an adequate etch selectivity with respect to the semiconductor layers stack 430. Various sizes of open spacing are designed to meet certain device structure needs, such as an open spacing for an interconnection contact to be formed later. As an example, a first open spacing $s_1$ in a first region 610 is substantially larger than a second open spacing $s_2$ in a second region 620. The second spacing $s_2$ is substantially larger than a third open spacing $s_3$ in a second region 630. For Example, in the PMOS unit, $s_1$ is in a range of 25 nm to 150 nm, $s_2$ is in a range of 20 nm to 50 nm and $s_3$ is in a range of 20 nm to 35 nm. For another example, in the NMOS unit, $s_1$ is in a range of 25 nm to 150 nm, $s_2$ is in a range of 20 nm to 35 nm and $s_3$ is in a range of 20 nm to 35 nm.

In the PMOS unit, after the semiconductor layer stack 430 being laterally exposed, a first thermal oxidation process is performed to the exposed semiconductor material layer stack 430 in the gate region 214. During the thermal oxidation process, at least a portion of each semiconductor layers in the semiconductor layer stack 430 is converted to a semiconductor oxide layer. The thermal oxidation process may be conducted in oxygen ambient, or in a combination of steam ambient and oxygen ambient.

In the NMOS unit, after the semiconductor layer stack 430 being laterally exposed, a selective etch process is performed to remove one type semiconductor layer in the semiconductor layer stack 430 and leave another type of semiconductor layer suspend in the gate region 214 (supported by the source/drain feature 240). As an example, SiGe layer 433 is removed by the selective etch and Si layer 434 is suspended in the gate region 214. Then a second thermal oxidation process is performed. The second thermal oxidation process is similar in many respects to the first thermal process discussed above. In one embodiment, the first and second thermal process is one thermal process.

Figure 3A:
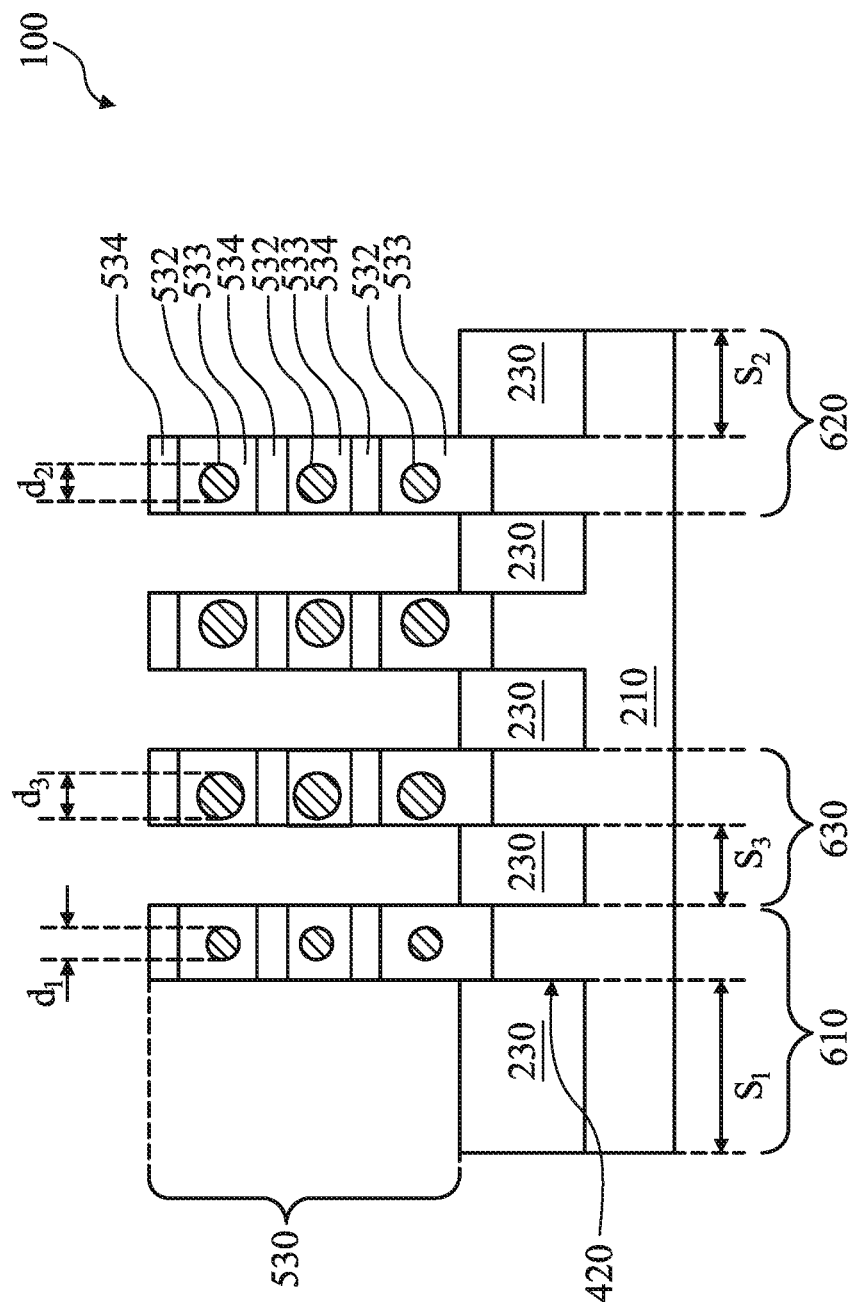
Figure 3B:
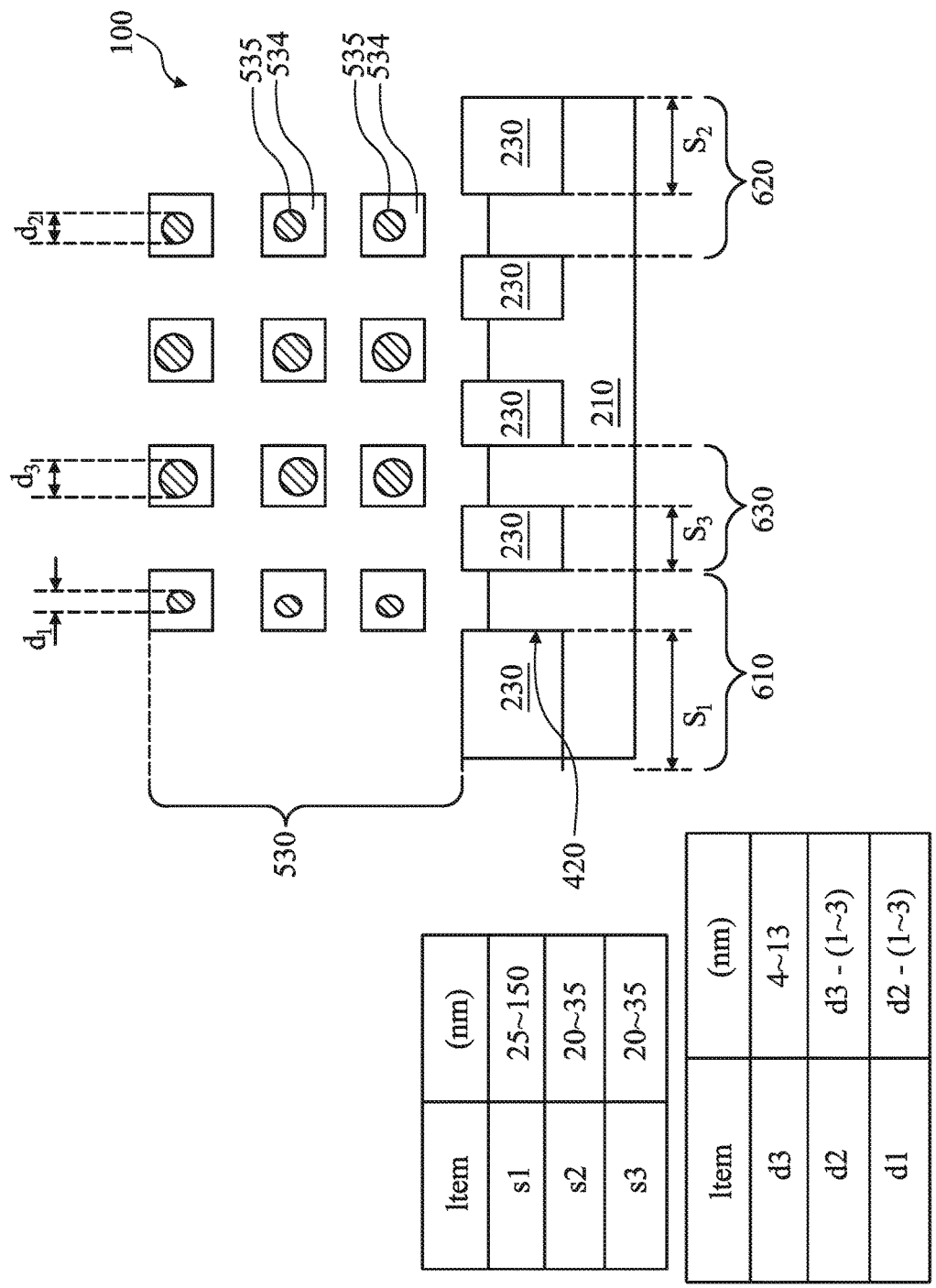

Referring to FIGS. 3A-3B, in the present embodiment, the first/second thermal oxidation is controlled to convert the exposed semiconductor layer stack 430 to a designed configuration of a semiconductor oxide layer stack 530, which has a wire feature 532 in predetermined semiconductor oxide layers. As an example, in the PMOS unit, the SiGe layer 433 is converted to a silicon germanium oxide 533 having a Ge wire feature 532 while the Si layer 434 is fully converted to the silicon oxide layer 534. The Ge wire feature 532 is referred to as Ge nanowire. As another example, in the NMOS unit, the suspended Si layer 434 is converted to the silicon oxide layer 534 having a Si wire feature 535. The Si wire feature 535 is referred to as Si nanowire.

In present embodiment, a diameter of wire feature 532/535 in the first, second and third regions, 610, 620 and 630 are substantially different. In one embodiment, the wire feature 532/535 formed in the first region 610 has a first diameter $d_1$ which is substantially smaller than a second diameter $d_2$ of the wire feature 532/535 formed in the second region 620. The second diameter $d_2$ is substantially smaller than a third diameter $d_3$ in the third region 630. In one embodiment, the first diameter $d_1$ is 10% or smaller than the second diameter $d_2$. The second diameter $d_2$ is 10% smaller than the third diameter $d_3$. For example, in the PMOS unit, $d_1$ is in a range of 4 nm to 15 nm, $d_2$ is in a range of 1 nm to 3 nm and $d_3$ is in a range of 1 nm to 3 nm. For another example, in the NMOS unit, $d_1$ is in a range of 4 nm to 13 nm, $d_2$ is in a range of 1 nm to 3 nm and $d_3$ is in a range of 1 nm to 3 nm.

In present embodiment, the diameter of the wire feature 532/535 in the long gate region is substantially smaller than the diameter of the respective wire feature 532/535 in the short gate region. In one embodiment, the diameter of the wire feature 532/535 in the long region is 20% or smaller than the diameter of the respective wire feature 532/535 in the short gate region.

After forming the wire feature 532/535, all layers of the semiconductor oxide stack 530 are removed by a selective etching process and the wire features 532/535 remain in the gate region 214. The wire features 532/535 aligning vertically in a same location of the gate region 214 are referred to as the nanowire set 310, as shown in FIGS. 1A-1C. The HK/MG 320 is formed in the gate region 214, including conformably wrapping over the nanowire set 310, as being described in FIGS. 1A-1C.

Figure 4:
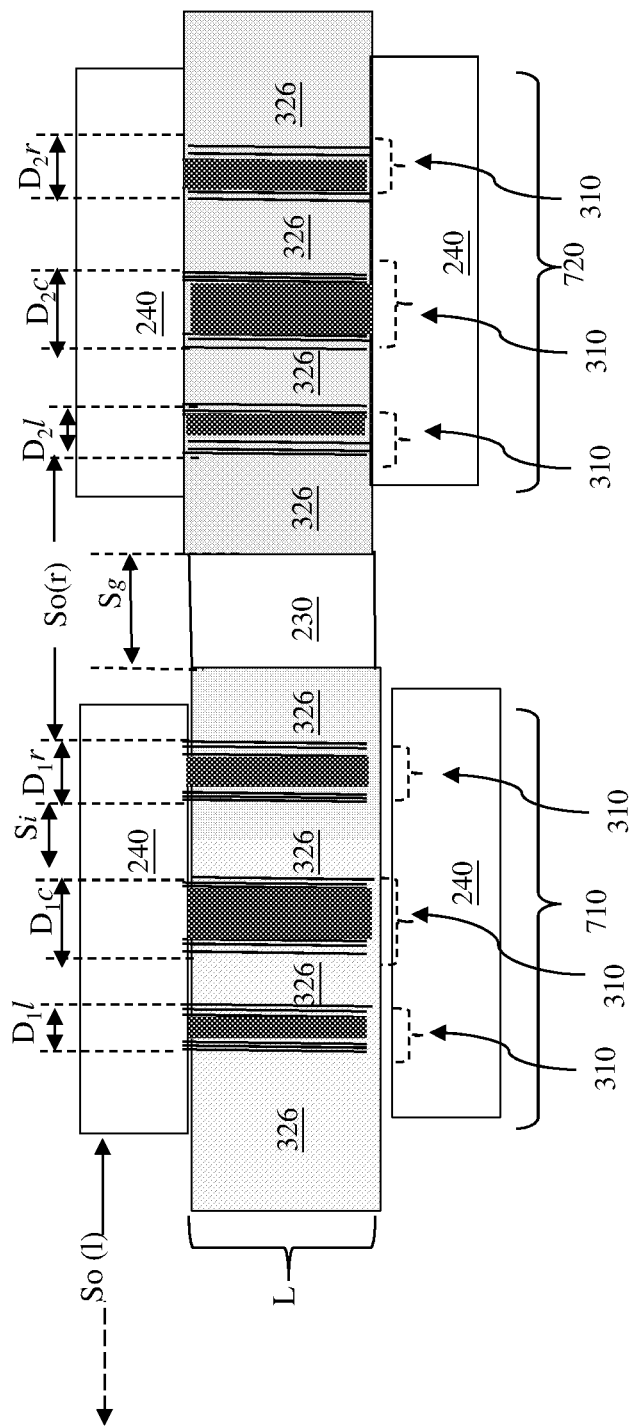
FIG. 4 is a top view of an example IC with nanowire sets.

Referring to FIG. 4, in one embodiment, a first transistor 710 is adjacent to a second transistor 720, each transistor may include a multiple nanowire sets 310. For the sake of description, diameters of nanowire set 310 located in the very left side, very right side and between them, of the transistor 710, are $D_1l$, $D_1r$ and $D_1c$ respectively. While diameters of nanowire set 310 located in the very left side, very right side and between them, of the transistor 720, are $D_2l$, $D_2r$ and $D_2c$ respectively. There may be more than one nanowire set 310 located between nanowire sets located in very left and right sides. Spacing between gate electrode 326 of transistor 710 and 720 is Sg. An outer spacing of the transistors 710 are So(l) and So(r) respectively. Spacing within the first transistor 710 is Si. In one embodiment, the first transistor 710 includes three nanowire sets 310. Both of So(l) and So(r) is larger than Si, $D_1$, is larger than $D_1l$ and $D_1r$. In another embodiment, In one embodiment, the first transistor 710 include four nanowire sets 310. Both of So(l) and So(r) is larger than Si, $D_1$, (there are two nanowire sets between the very left and right nanowire set) are larger than $D_1l$ and $D_1r$.

The IC 100 may have various additional features and regions for a CMOS or MOS device, known in the art. For example, various contacts/vias/lines and multilayers interconnect features (e.g., metal layers and interlayer dielectrics) are formed over the substrate 210, configured to connect the various features or structures of the IC 100. A multilayer interconnection may include vertical interconnects, such as conventional vias or contacts, and horizontal interconnects, such as metal lines. The various interconnection features may utilize various conductive materials including copper, tungsten, aluminum, and/or silicide, for example, PtSi, CoSi2, NiSi, NiPtSi, WSi2, MoSi2, TaSi2, or other refractory metal silicide. In one example, a damascene and/or dual damascene process is used to form a copper related multilayer interconnection structure.

Based on the above, the present disclosure offers an integrated circuit with nanowire set in a PMOS unit and a NMOS unit. The nanowire set has one or more nanowire. The nanowire is formed with different diameter according to its different environments and locations, such as a size of an open spacing between adjacent nanowire set, or a gate region length.

The present disclosure provides many different embodiments of an integrated circuit (IC). The IC includes a substrate having a metal-oxide-semiconductor (MOS) region, first gate, source and drain regions of a first device in the MOS region. The first gate region has a first length. The IC also includes a first nanowire set disposed in the first gate region, the first nanowire set including a nanowire having a first diameter and connecting to a first feature in the first source region and the first feature in the first drain region. The IC also includes second gate, source and drain regions of a second device in the MOS region. The second gate region has a second length. The IC also includes a second nanowire set disposed in the second gate region, the second nanowire set including a nanowire having a second diameter and connecting to a second feature in the second source region and the second feature in the second drain region. If the first length is greater than the second length, the first diameter is less than the second diameter. If the first length is less than the second length, the first diameter is greater than the second diameter.

In another embodiment, an integrated circuit includes a substrate having a metal-oxide-semiconductor (MOS) region, first gate, source and drain regions of a first device in the MOS region having a first gate region length. The IC also includes a plurality of first nanowire sets disposed in the first gate region having a different spacing between two adjacent first nanowire sets, the first nanowire set including a nanowire having a first diameter and connecting to a common feature in the first source region and a common feature in the first drain region. A diameter of the first nanowire set is different from the first diameter of a different first nanowire set if the different first nanowire set has a different spacing. The IC also includes second gate, source and drain regions of a second device in the MOS region having a second gate region length. The IC also includes a second nanowire set disposed in the second gate region, the second nanowire set including a nanowire having a second diameter and connecting to a feature in the second source region and a feature in the second drain region. If the first length is greater than the second length, the first diameter is less than the second diameter and if the first length is less than the second length, the first diameter is greater than the second diameter.

In yet another embodiment, an integrated circuit (IC) includes a substrate having an N-type metal-oxide-semiconductor (NMOS) region and a P-type metal-oxide-semiconductor (PMOS) region, a plurality of gate structures in the NMOS region and in the PMOS region. A length of the gate structures and a spacing of the gate structures varies between at least two thereof. A nanowire set is disposed in the each of the plurality of gate structures. A diameter of each nanowire in each nanowire set corresponds directly with a relative spacing to an adjacent gate structure, and a relative length of the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for integrated circuit (IC) manufacturing, the method comprising:
    providing a substrate having a first gate region for a first device, and a second gate region for a second device, and wherein the first gate region has a first channel length, and the second gate region has a second channel length that is different from the first channel length;
    forming a first fin in at least the first gate region;
    forming a second fin in at least the second gate region;
    forming a first stack of semiconductor layers over the first fin;
    forming a second stack of semiconductor layers over the second fin; and
    performing an oxidation process to the first and second stacks, thereby forming first and second semiconductor wires in the first and second gate regions respectively, each of the first and second semiconductor wires being wrapped by a semiconductor oxide layer, wherein the first and second semiconductor wires have different cross-sectional areas in a respective plane that is perpendicular to their respective longitudinal direction.

2. The method of claim 1, further comprising:
    selectively removing at least one semiconductor layer from the second stack before the performing of the oxidation process.

3. The method of claim 1, wherein the oxidation process is conducted in oxygen ambient, or in a combination of steam ambient and oxygen ambient.

4. The method of claim 1, wherein each of the first and second stacks includes pairs of a silicon layer disposed over a silicon germanium layer.

5. The method of claim 4, further comprising:
    selectively removing the silicon germanium layers from the second stack before the performing of the oxidation process to the first and second stacks.

6. The method of claim 5, wherein the first semiconductor wires are germanium wires and are each wrapped by a silicon germanium oxide layer, the second semiconductor wires are silicon wires and are each wrapped by a silicon oxide layer, and the silicon layers in the first stack are converted to silicon oxide layers by the oxidation process.

7. The method of claim 6, further comprising:
    selectively etching the silicon oxide layers and the silicon germanium oxide layers in the first and second stacks, thereby leaving the first and second semiconductor wires suspended over the first and second fins respectively.

8. The method of claim 7, further comprising:
    forming first and second gate stacks, each of the first and second gate stacks having at least one layer wrapping the first and second semiconductor wires respectively.

9. The method of claim 5, wherein the first device is a p-type device, and the second device is an n-type device.

10. The method of claim 1, wherein the second channel length is greater than the first channel length and each of the second semiconductor wires has a smaller cross-sectional area than each of the first semiconductor wires.

11. The method of claim 10, wherein each of the first and second devices is a p-type device.

12. The method of claim 10, wherein each of the first and second devices is an n-type device.

13. A method for integrated circuit (IC) manufacturing, the method comprising:
providing a substrate having a first gate region;
forming first, second, and third fins in the first gate region, wherein the second fin is disposed between the first and third fins;
forming first, second, and third stacks of semiconductor layers over the first, second, and third fins respectively; and
performing an oxidation process to the first, second, and third stacks, thereby forming first, second, and third semiconductor wires over the first, second, and third fins respectively, wherein each of the first, second, and third semiconductor wires is wrapped by a semiconductor oxide layer, wherein a cross-sectional area of the second semiconductor wire is greater than that of the first and third semiconductor wires.

14. The method of claim 13, wherein each of the first, second, and third stacks includes pairs of a silicon layer disposed over a silicon germanium layer.

15. The method of claim 14, further comprising:
selectively removing the silicon germanium layers from each of the first, second, and third stacks before the performing of the oxidation process.

16. The method of claim 13, further comprising:
selectively removing the semiconductor oxide layers from the first, second, and third stacks; and
forming gate stacks over the first, second, and third semiconductor wires, wherein at least one layer of the gate stacks conformally wraps each of the first, second, and third semiconductor wires.

17. A method for integrated circuit (IC) manufacturing, the method comprising:
providing a substrate having a first gate region and a second gate region;
forming first, second, and third fins in the first gate region, wherein the second fin is disposed between the first and third fins;
forming fourth, fifth, and sixth fins in the second gate region, wherein the fifth fin is disposed between the fourth and sixth fins;
forming first, second, and third stacks of semiconductor layers over the first, second, and third fins respectively;
forming fourth, fifth, and sixth stacks of semiconductor layers over the fourth, fifth, and sixth fins respectively; and
performing an oxidation process to the first, second, third, fourth, fifth, and sixth stacks, thereby forming first, second, third, fourth, fifth, and sixth semiconductor wires over the first, second, third, fourth, fifth, and sixth fins respectively, wherein each of the first, second, third, fourth, fifth, and sixth semiconductor wires is wrapped by a semiconductor oxide layer, wherein a cross-sectional area of the second semiconductor wire is greater than that of the first and third semiconductor wires, and a cross-sectional area of the fifth semiconductor wire is greater than that of the fourth and sixth semiconductor wires.

18. The method of claim 17, wherein the first gate region has a greater channel length than the second gate region, and wherein the cross-sectional area of the second semiconductor wire is smaller than the cross-sectional area of the fifth semiconductor wire.

19. The method of claim 17, wherein each of the first, second, third, fourth, fifth, and sixth stacks includes pairs of a silicon layer disposed over a silicon germanium layer, further comprising:
before the performing of the oxidation process, selectively removing the silicon germanium layer in the second gate region while keeping the silicon germanium layer in the first gate region.

20. The method of claim 19, wherein each of the first, second, and third semiconductor wires is a germanium wire, and each of fourth, fifth, and sixth semiconductor wires is a silicon wire.

* * * * *